(12) United States Patent
Lin et al.

(10) Patent No.: US 6,992,021 B2
(45) Date of Patent: Jan. 31, 2006

(54) METHOD FOR FORMING A SILICON NITRIDE LAYER

(75) Inventors: Shian-Jyh Lin, Chiayl (TW); Hai-Han Hung, Taoyuan (TW); Chung-Yuan Lee, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 188 days.

(21) Appl. No.: 10/620,518

(22) Filed: Jul. 16, 2003

(65) Prior Publication Data

US 2004/0082200 A1 Apr. 29, 2004

(30) Foreign Application Priority Data

Oct. 25, 2002 (TW) .............................. 91125200 A

(51) Int. Cl.
  *H01L 21/39* (2006.01)
  *H01L 21/469* (2006.01)
(52) U.S. Cl. ...................... 438/775; 438/724; 438/776

(58) Field of Classification Search ................ 438/775, 438/776, 724
See application file for complete search history.

(56) References Cited

U.S. PATENT DOCUMENTS

| | | | | |
|---|---|---|---|---|
| 5,663,087 A | * | 9/1997 | Yokozawa | ................... 438/762 |
| 6,060,403 A | * | 5/2000 | Yasuda et al. | ............... 438/765 |
| 6,716,757 B2 | * | 4/2004 | Lin et al. | .................... 438/705 |

* cited by examiner

*Primary Examiner*—Alexander Ghyka
(74) *Attorney, Agent, or Firm*—Quintero Law Office

(57) ABSTRACT

A method of forming a silicon nitride layer. The method comprises providing a substrate having a silicon surface thereon, performing an ion implant process on the silicon surface, implanting nitrogen atoms into the silicon surface, and performing a thermal nitridation process and forming a silicon nitride layer on the substrate, wherein the silicon nitride layer comprises the silicon nitride formed on the silicon surface by reaction of the silicon surface with the nitrogen atoms contained therein.

12 Claims, 5 Drawing Sheets

METHOD FOR FORMING A SILICON NITRIDE LAYER

BACKGROUND OF THE INVENTION

1. Field of the Invention

The present invention relates to semiconductor technology, in particular to a method of forming a silicon nitride layer.

2. Description of the Related Art

Silicon nitride ($Si_3N_4$), a popular dielectric material in semiconductor fabricating process, is commonly used in, for example, masking layers, stop layers or passivation layers on integrated devices because of either its ability to protect against the diffusion of impurities and water or a predetermined mechanical strength it performed.

Normally, silicon nitride can be formed by a chemical vapor deposition (CVD) process under low pressure or a plasma enhanced chemical vapor deposition (PECVD) process.

Presently, silicon nitride is formed by reacting dichlorosilane and ammonia at reduced pressure (for example between 0.1 to 10 Torr.) and a temperature ranging from 700 to 800° C. through LPCVD process to achieve better uniformity.

In addition, silicon nitride of PECVD process can be formed by reacting silane, ammonia and nitrogen at lower temperature (normally below 450° C.) and contains hydrogen ranging from 7 to 30% therein. Thus, its stoichimetry is shown as $SiN_x$ and differs from that formed by LPCVD.

Thus, in semiconductor fabricating process, thicker silicon nitride layer for masking layer or stop layer of chemical mechanical polishing (CMP) or etching is normally formed by LPCVD. Thicker silicon nitride layer for passivation layer of back end of line (BEOL) process can be formed by PECVD at a lower process temperature.

In addition, another method for forming silicon nitride layer can be thermal nitridation in an ambient of nitrogen atoms at temperature exceeding 1000° C. to nitridize the exposed silicon surface on a substrate with the ambient nitrogen atoms, thus forming a silicon nitride layer. The thermal nitradation, for example, can be a furnace nitridation process or a rapid thermal nitridation (RTN) process. Silicon nitride layer formed by a conventional thermal nitridation process is illustrated by a schematic cross-section shown in FIG. 1.

In FIG. 1, a semiconductor substrate 10, for example a silicon substrate, is provided. Plan surface and an opening OP on and within the substrate 10 expose silicon surfaces thereof. Next, a thermal nitridation process (not shown) is performed. During the thermal nitridation process, the substrate 10 is heated to a predetermined temperature by heaters in the ambient environment (not shown) and then a nitrogen-containing gas G is introduced and decomposed at high ambient temperature to liberate nitrogen atoms therefrom. Thus, the nitrogen atoms can react with the exposed silicon surfaces of the plan surface and the opening OP to form a silicon nitride layer 12 thereon.

Nevertheless, when a thin silicon nitride layer is formed on the substrate 10, because of the dense crystalline structure of the formed silicon nitride layer, the nitrogen atoms in ambient environment become difficult to diffuse and react with the silicon atoms in the deeper portion of the surface of the substrate 10. Thus, the thickness of the silicon nitride layer 12 is restricted by the subsequent mass transfer issue of the thermal nitridation process. Normally, the thickness of the silcon nitride layer 12 formed by thermal nitridation is about 20 Å and cannot be increased by increasing the reaction time or the process temperature of the thermal nitridition process.

In table 1, results of tests forming silicon nitride layer on a plane silicon wafer by thermal nitridation at a fixed flow rate (about 20 SCCM) of a nitrogen-containing gas ($N_2$ here) are shown. The thickness of a silicon nitride layer formed by rapid thermal nitridation (RTN) process and the process conditions thereof are also shown in table 1.

TABLE 1

| Process temp. (° C.) | Process time (sec) | thickness (Å) |
|---|---|---|
| 1050 | 34 | 17.4 |
| 1050 | 90 | 18.9 |
| 1100 | 90 | 20.5 |

As shown in table 1, an unobvious increase (less than 2 Å) of the formed silicon nitride layer thickness is found by the elevated process temperature (about 50° C.) or the process time (about double the original process time) and supports the described theory.

SUMMARY OF THE INVENTION

Accordingly, the invention provides a method of forming a silicon nitride layer using thermal nitridation to form a thicker silicon nitride layer.

Another object of the invention is to provide a method of forming a silicon nitride layer by which a thicker silicon nitride layer is formed on sidewalls of a trench as a mask layer with better tolerance to etchants in wet etching. A larger bottle-shaped trench can thus be formed for use with a bottle-shaped trench capacitor process.

Thus, a method of forming a silicon nitride layer in accordance with the present invention comprises the steps of providing a substrate having a silicon surface thereon, performing an ion implant process on the silicon surface and implanting nitrogen atoms in the silicon surface, and performing a thermal nitridation process and forming a silicon nitride layer on the substrate, wherein the silicon nitride layer comprises the silicon nitride formed on the silicon surface by reaction of the silicon surface with the nitrogen atoms therein.

In addition, the method of forming a silicon nitride layer for a bottle-shaped trench process in accordance with the present invention comprises the steps of providing a silicon substrate, forming a trench therein, conformally depositing a dielectric layer in the trench, selectively etching the dielectric layer, exposing an upper region in the trench and sidewalls thereof, leaving a lower region in the trench covered by the remaining dielectric layer, performing an ion implant process, implanting nitrogen atoms into the silicon substrate adjacent to the sidewalls, performing a thermal nitridation process, forming a silicon nitride layer on the surface of the sidewalls, wherein the silicon nitride layer comprises the silicon nitride formed on the silicon surface by reaction of the silicon surface with the nitrogen atoms therein, removing the remaining dielectric layer from the lower region of the trench, and using the silicon nitride layer as an etching mask, etching the silicon substrate in the lower region, forming an expanded region therein, and forming a bottle-shaped trench consisting of the trench portion in the upper region and the expanded region in the lower portion.

Thus, a thicker silicon nitride layer formed by the method of the present invention further resists etchant to ensure that the shape of a device, for example a bottle-shaped trench, remains intact during the etching process.

The method of the invention can enlarge the process window of an etching and a device structure with a larger space, for example an expanded portion of a bottle-shaped trench, can be formed and a larger space for use in a trench type capacitor is provided to increase the capacity thereof.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Method of Forming a Silicon Nitride Layer

FIGS. 2a to 2d are cross-sections of a method of forming a silicon nitride layer of the invention.

Figure 1:
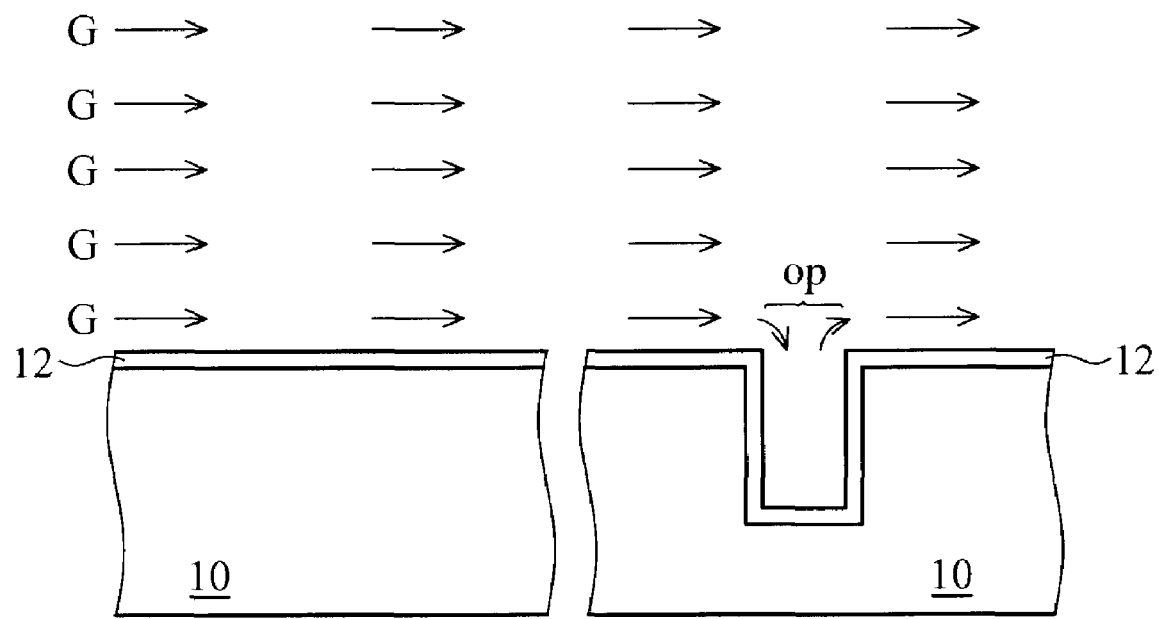
FIG. 1 is a cross-section of a silicon nitride layer formed by thermal nitridation process as referenced in the Prior Art.
Figure 2A:
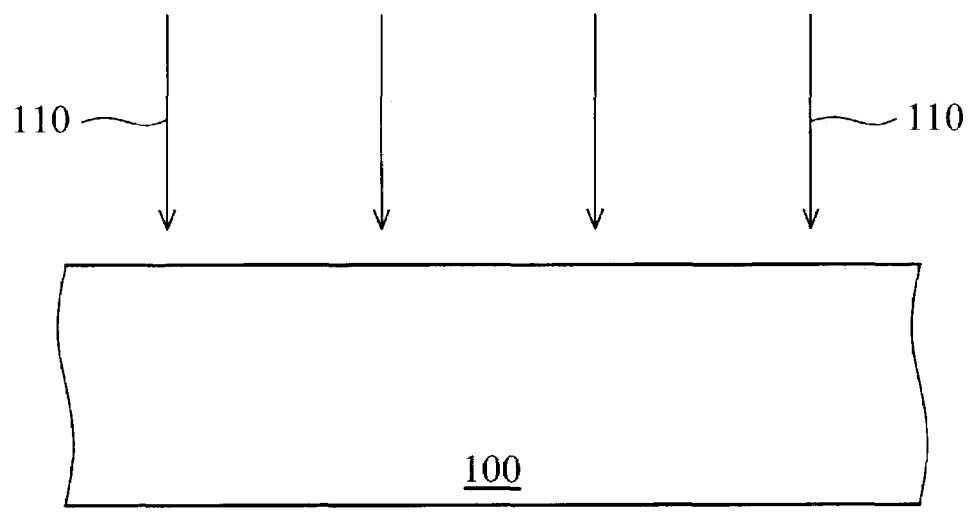
FIGS. 2a to 2d are cross-sections of a method of forming a silicon nitride layer in one embodiment of the invention.

In FIG. 2a, a semiconductor substrate 100, for example a silicon substrate, having an exposed silicon surface (a surface of the substrate 100) thereon is provided. Next, an ion implant process 110 is performed to implant nitrogen atoms with a predetermined dosage between $1*10^{14}$ atoms/cm$^2$ and $5*10^{17}$ atoms/cm$^2$ into the substrate 100. A gas source of the nitrogen atoms for the ion implant process 110 can be nitrogen gas ($N_2$).

Figure 2B:
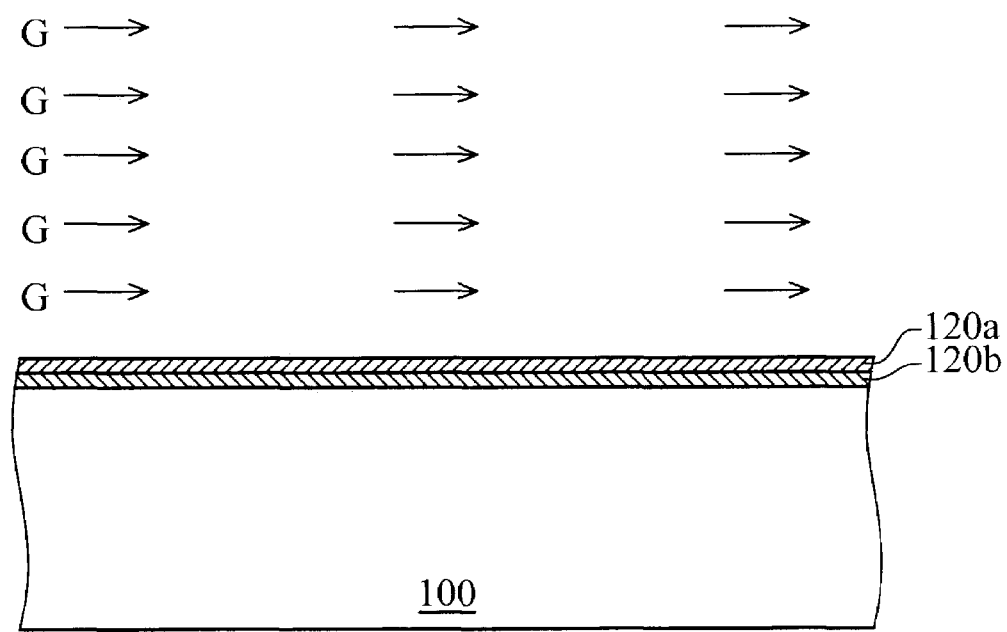

In FIG. 2b, a thermal nitridation process (not shown), for example a furnace nitridation process of a rapid thermal nitridation (RTN) process, is performed. Heaters (not shown) disposed in a reactor heat the substrate 100 to a predetermined process temperature between 500° C. and 1200° C. Then a nitrogen-containing gas G is provided and thermally decomposed under the process temperature to liberate nitrogen atoms therein to react with silicon atoms on and in the silicon surface (referring to substrate 100). The nitrogen-containing gas G, for example, can be $N_2$, $NH_3$, $N_2O$ or NO.

During the described ion implant process 110, the single crystal bonding in the silicon surface of the substrate 100 is also damaged by a predetermined implant energy, for example between 200 eV and 200 Kev, thereof. Thus, the nitrogen atoms liberated in the described thermal nitridation process can further diffuse into a deeper level of the silicon surface (referring to the silicon substrate 100) and react with the silicon atoms therein, forming a first silicon nitride layer 120a on the silicon surface (referring to the silicon substrate 100). In addition, during the thermal nitridation process, the nitrogen atoms implanted into the substrate 100 also react with adjacent silicon atoms, and a second silicon nitride layer 120b is formed at the same time. Thus, a composite silicon nitride layer consisting of the first silicon nitride layer 120a and the second silicon nitride layer 120b is formed. Furthermore, thickness of the composite silicon nitride layer can be properly adjusted by verifying the implant energy and the implant dosage in the ion implant process 110.

Figure 2C:
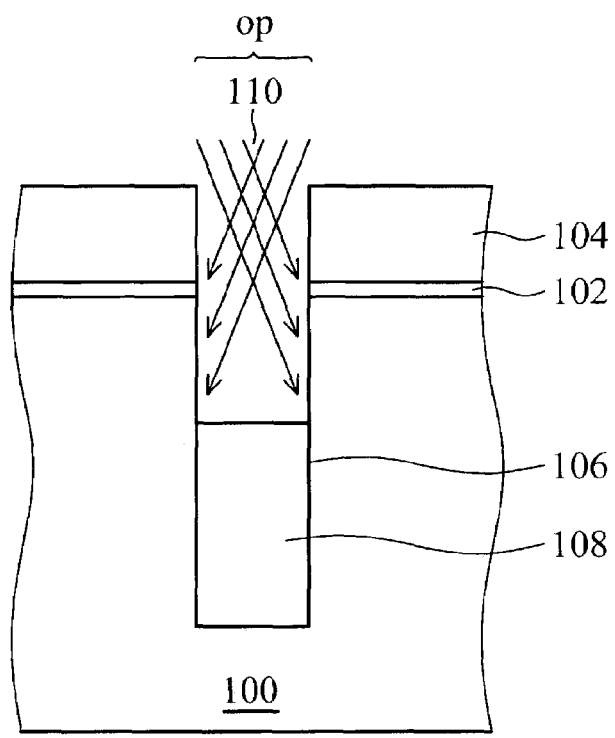

The method of forming a silicon nitride layer in accordance with the present invention can also be used on a silicon surface within an opening in a substrate. In FIG. 2c, a semiconductor substrate 100, for example a silicon substrate, with a pad layer comprising a pad oxide layer 102 and a mask layer 104 thereon is provided. An opening OP is formed in the pad layer and the substrate 100 by proper lithography and etching processes and a device structure, for example a trench 106, is also formed in the opening OP.

First, a protecting layer 108 with a predetermined thickness is formed in the trench 106 such that silicon surfaces of the substrate 100 and sidewalls thereof in the opening OP are exposed. The protecting layer 108 can be, for example, a spin-on glass.

Next, an ion implant process 110 is performed and nitrogen atoms with a predetermined dosage between $1*10^{14}$ atoms/cm$^2$ to $5*10^{17}$ atoms/cm$^2$ formed by a source gas such like nitrogen gas ($N_2$) are implanted into the silicon surfaces of the substrate 100 and sidewalls thereof through a predetermined implant energy between 200 eV and 200 KeV and the single crystal bonding on the surfaces of the substrate 100 can be broken by energy of the ion implant process 110 to make diffusion and reaction with the silicon atoms therein of the nitrogen atoms in the following nitridation process easier.

Figure 2D:
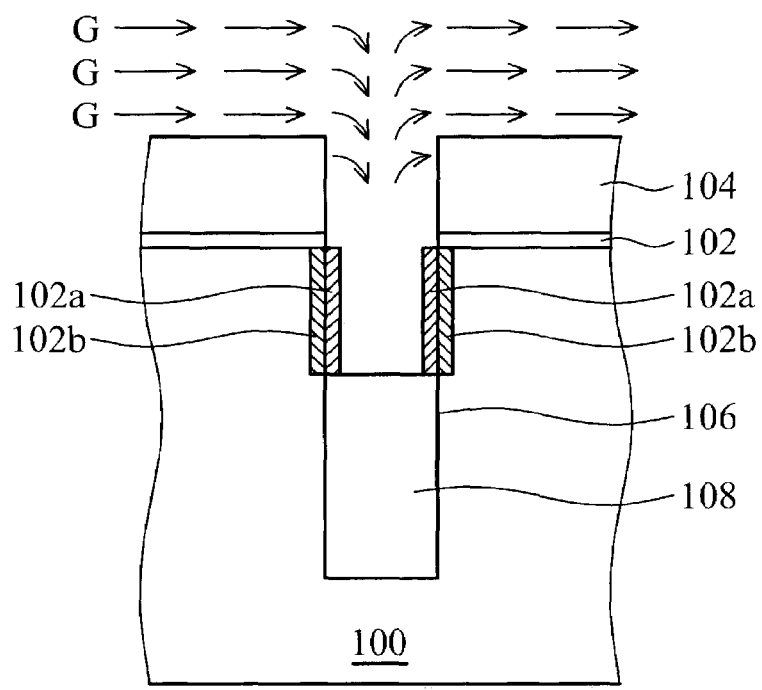

In FIG. 2d, then a thermal nitridation process (not shown), for example a furnace nitridation process or a rapid thermal nitridation (RTN) process, is performed. During the thermal nitridation process, heaters (not shown) disposed in a reactor heat the substrate 100 to a predetermined process temperature between 500° C. and 1200° C. Then a nitrogen-containing gas G is provided and thermally decomposed under the process temperature to liberate nitrogen atoms to react with silicon surfaces (substrate 100) of sidewalls of the trench 106. The nitrogen-containing gas G, for example, can be $N_2$, $NH_3$, $N_2O$ or NO.

Due to the breaks of the single silicon bonding in the silicon surfaces of the substrate 100 that adjacent sidewalls of the trench 106 during the mentioned ion implant process 110, nitrogen atoms in ambient environment perform a better diffusion and react with silicon atoms in the deeper level of the silicon surface.

Thus, a first silicon nitride layer 120a is formed. In addition, the implanted nitrogen atoms also bind the adjacent silicon atoms in the silicon surface to form a second silicon nitride layer 120b. Thus, a composite silicon nitride layer consisting of the first silicon nitride layer 120a and the second silicon nitride layer 120b is formed.

Furthermore, thickness of the composite silicon nitride layer can be properly adjusted by verifying the implant energy and the implant dosage in the ion implant process 110.

Method of Forming a Silicon Nitride Layer for Bottle-Shaped Trench Process

The method of forming a silicon nitride layer in accordance with the present invention can be also used for practical semiconductor fabricating process and is not restricted by the described applications. An application of the process for forming bottle-shaped trench is illustrated in FIG. 3a to 3d.

Figure 3A:
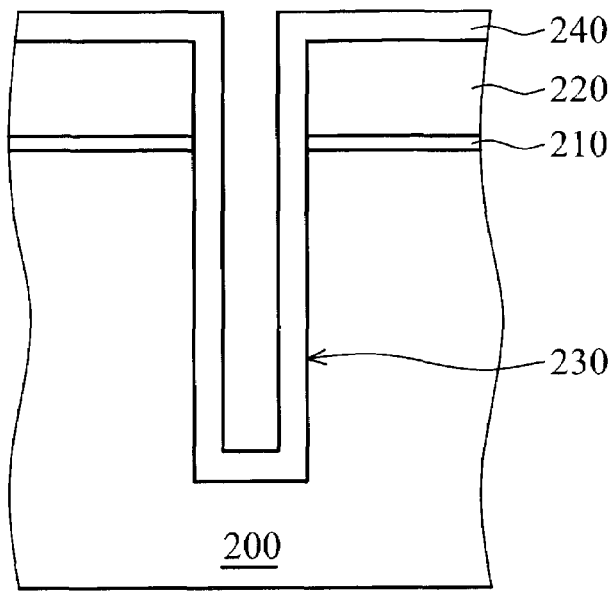
FIGS. 3a to 3d are cross-sections of a bottle-shaped trench process using the silicon nitride layer fabrication method of the invention.

First, in FIG. 3a a semiconductor substrate 200, for example a silicon substrate, with a pad layer comprising a pad oxide layer 210 and a mask layer 220 thereon is provided. Then a trench 230 is formed in these layers and the substrate 200 by proper lithography and etching processes (not shown).

Next, a conformal dielectric layer 240, for example a silicon dioxide layer, is deposited on the mask layer 220 and in the trench 230 by methods such as LPCVD process or liquid phase deposition (LPD) process.

Figure 3B:
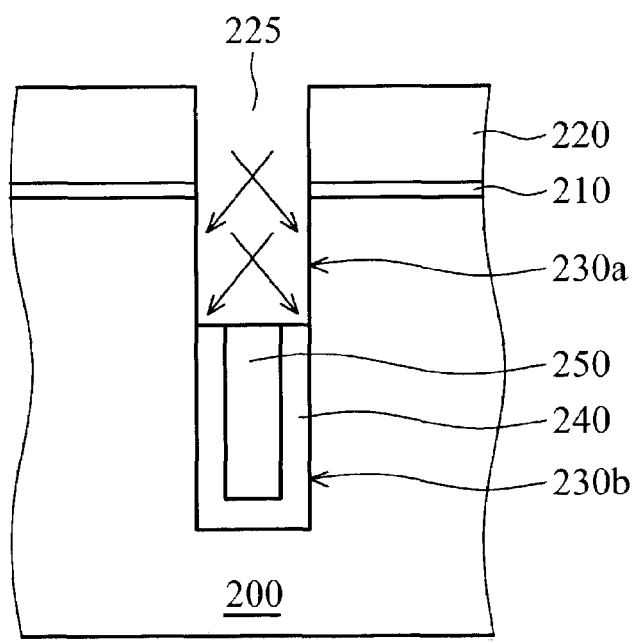

Next, in FIG. 3b, a layer of protecting material, for example photoresist (PR) material, is blanketly deposited on the dielectric layer 240 on and within the trench 230 and then etched back and properly recessed. Thus, a protecting layer 250 is left in the trench 230. Then the dielectric layer not covered by the protecting layer 250 in the trench 230 is removed by an etching process (not shown). Thus, the trench 230 is divided into an upper portion 230a exposing sidewalls thereof and a lower portion 230b covered by the protecting layer 250 and the dielectric layer 240.

Next, an ion implant process 255 is performed to sidewalls of the upper portion 230a and nitrogen atoms with a predetermined dosage between $1*10^{14}$ atoms/cm$^2$ and $5*10^{17}$ atoms/cm$^2$ from a gas source such as nitrogen gas (N$_2$) are implanted into the substrate 200 adjacent to sidewalls in the upper portion 230a under a predetermined implant energy between 200 eV and 200 KeV. Thus, the single crystal bonding of the substrate 200 can be broken by the ion implant process 225 wherein nitrogen atoms in ambient environment perform better diffusion and react with silicon atoms in the deeper levels of the silicon surface. Thus, a thicker silicon nitride layer can be obtained by thermal nitridation process.

Figure 3C:
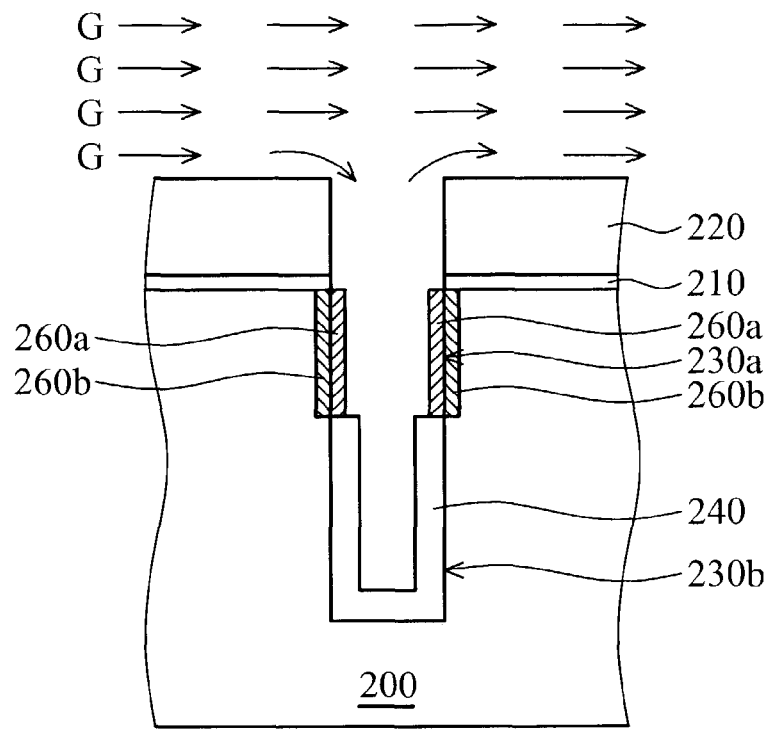

In FIG. 3c, the protecting layer 250 in the lower portion is removed by proper etching process (not shown) such as wet etching. Then a thermal nitridation process (not shown), for example a furnace nitridation process or a rapid thermal nitridation (RTN) process, is performed. During the thermal nitridation process, heaters (not shown) disposed in a reactor to heat the substrate 200 to a predetermined process temperature between 500° C. to 1200° C. Then a nitrogen-containing gas G is provided and thermally decomposed under the process temperature to liberate nitrogen atoms to react with silicon surfaces (substrate 200) of sidewalls in the upper portion 230a. The nitrogen-containing gas G, for example, can be N$_2$, NH$_3$, N$_2$O or NO.

Due to the breaks of the single silicon bonding in the substrate 200 adjacent to sidewalls of the upper portion 230a by the described ion implant process 225, nitrogen atoms in ambient environment perform better diffusion and react with silicon atoms in the deeper level of the silicon surface (referring to the substrate 200).

In addition, the implanted nitrogen atoms also bind the adjacent silicon atoms to form a second silicon nitride layer 260b. Thus, a composite silicon nitride layer consisting of the first silicon nitride layer 260a and the second silicon nitride layer 260b is formed. Furthermore, thickness of the composite silicon nitride layer can be properly adjusted by verifying the implant energy and the implant dosage in the ion implant process 225.

Figure 3D:
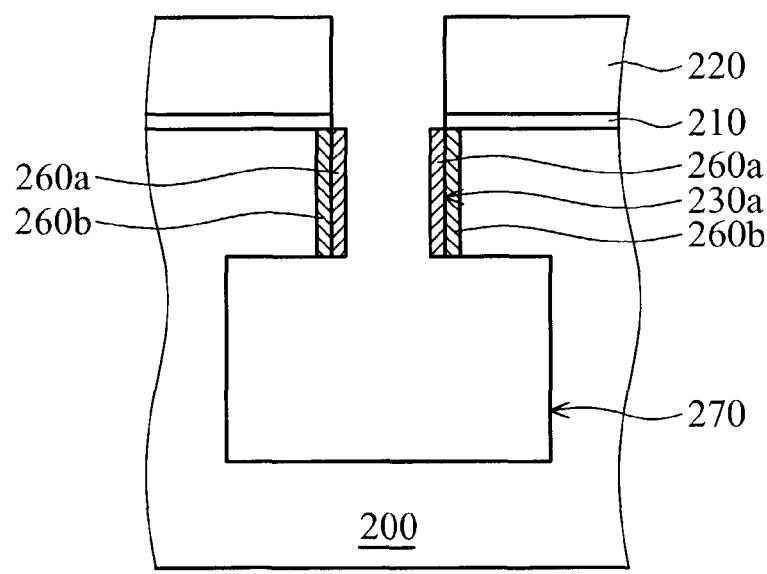

In FIG. 3d, the remaining dielectric layer 240 within the trench 260 is removed and the silicon material within the mentioned lower portion 230b is isotropically etched by an etching (not shown) such as wet etching process using etchants containing ammonia or mixtures of nitric acid and hydrofluoric acid. Thus, an expanded region 270 in the lower portion 230b being wider than the trench in the upper portion 230a is formed using the silicon nitride layer as a is mask layer. The expanded region 270 and the described trench in the upper portion 230 compose a bottle-shaped trench as shown in FIG. 3d.

Since etchant used in the mentioned wet etching often contains nitric acid $_{(aq)}$, an etching rate between 15 Å to 3000 Å is performed on the mask layer. The silicon nitride layer here is restricted by the process ability of conventional thermal nitridation process. The thickness is merely about 20 Å and will be lost in the etching such that the space of the expanded region 270 is thus restricted. Once the silicon nitride layer is entirely etched out during the wet etching, over-etching occurs and the silicon of the substrate 200 in the upper portion 230a will also be etched, thus the shape of the formed bottle is affected.

In the present invention, the second silicon nitride layer 260b can further resist the etchant in the etching process even though the first silicon nitride layer is entirely removed and the bottle suffers no deformation.

The method of the invention enlarges the process window of the wet etching and a extended portion 270 providing larger space for the use in a trench type capacitor is formed to increase the capacity thereof.

In table 2, results of tests forming silicon nitride layer on a plane silicon wafer by the method of the invention at a fixed flow rate (about 20 SCCM) reacting gas are shown. Thickness of silicon nitride layers formed by the two steps processes comprising a first ion implant process and a second rapid thermal nitridation (RTN) process and the process conditions thereof are shown in table 2.

TABLE 2

| Source of nitrogen atoms | Dosage and Energy of implant (energy/dosage) | Process temp. (° C.) | Process time of RTN (sec) | Thickness (Å) |
|---|---|---|---|---|
| N$_2$ | 5 kev/5e14 | 1050 | 34 | 19 |
| N$_2$ | 5 kev/1e15 | 1050 | 34 | 23 |

As shown, a thickness of a silicon nitride layer formed by the method of the invention under implant energy of 5 KeV, implant dosage $5*10^{14}$ atoms/cm$^2$, using nitrogen gas (N$_2$) as a source gas, RTN temperature of 1050 C. and process time of 34 seconds is 19 Å and a 9% increase over that formed by a conventional thermal nitridation process as shown in table 1, is found.

In addition, when implant dosage used is doubled, a 32% increase (about 4 Å) in the thickness of the silicon nitride layer is found over that in table 1. The method of the invention can effectively increase the thickness of a silicon nitride layer formed by a thermal nitridation process.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming a silicon nitride layer for a bottle-shaped trench process, comprising:
   providing a silicon substrate;
   forming a trench in the silicon substrate;
   conformally depositing a dielectric layer in the trench;
   selectively etching the dielectric layer, exposing an upper region in the trench and sidewalls thereof, leaving a lower region in the trench covered by the remaining dielectric layer;
   performing an ion implant process, implanting nitrogen atoms into the silicon substrate adjacent to the sidewalls;

performing a thermal nitridation process, forming a silicon nitride layer on the surface of the sidewalls, wherein the silicon nitride layer includes the silicon nitride formed on the silicon surface by reaction of the silicon surface with the nitrogen atoms therein;

removing the remaining dielectric layer from the lower region of the trench; and using the silicon nitride layer as an etching mask, etching the silicon substrate in the lower region, forming an expanded region therein, and forming a bottle-shaped trench consisting of the trench portion in the upper region and the expanded region in the lower portion.

2. The method as claimed in claim 1, wherein the silicon nitride layer further comprises the silicon nitride formed by reaction of the silicon surface with a nitrogen-containing gas in the thermal nitridation process.

3. The method as claimed in claim 1, wherein the dielectric layer is silicon dioxide.

4. The method as claimed in claim 1, wherein the method for depositing the dielectric layer is LPCVD or liquid phase deposition (LPD).

5. The method as claimed in claim 1, wherein the method as claimed in claim 1, wherein the source gas for the ion implant process is nitrogen ($N_2$).

6. The method as claimed in claim 1, wherein the implant energy for the ion implant process is between 200 eV and 200 KeV.

7. The method as claimed in claim 1, wherein the implant dosage for the ion implant process is between $1*10^{14}$ atoms/cm$^2$ and $5*10^{17}$ atoms/cm$^2$.

8. The method as claimed in claim 1, wherein the thermal nitridation process is a furnace nitridation process or a rapid thermal nitridation (RTN) process.

9. The method as claimed in claim 1, wherein the process temperature of the thermal nitridation process is between 500° C. and 120° C.

10. The method as claimed in claim 1, wherein the etching method for forming the expanded region is wet etching.

11. The method as claimed in claim 1, wherein the expanded region is wider than the trench in the upper region.

12. The method as claimed in claim 1, wherein the process gas for the thermal nitridation process is $NH_3$, $N_2$, $N_2O$ or NO.

* * * * *